(12) United States Patent
Shatalov et al.

(10) Patent No.: US 10,177,534 B2
(45) Date of Patent: Jan. 8, 2019

(54) ELECTRON BEAM PUMPING FOR LIGHT EMISSION

(71) Applicant: Sensor Electronic Technology, Inc., Columbia, SC (US)

(72) Inventors: Maxim S. Shatalov, Columbia, SC (US); Michael Shur, Latham, NY (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/139,813

(22) Filed: Apr. 27, 2016

(65) Prior Publication Data

US 2016/0315449 A1    Oct. 27, 2016

Related U.S. Application Data

(60) Provisional application No. 62/153,061, filed on Apr. 27, 2015.

(51) Int. Cl.
| | |
|---|---|
| *H01S 5/00* | (2006.01) |
| *H01S 5/30* | (2006.01) |
| *H01S 5/04* | (2006.01) |
| *H01S 5/323* | (2006.01) |
| *H01S 5/06* | (2006.01) |

(Continued)

(52) U.S. Cl.
CPC ............. *H01S 5/3013* (2013.01); *H01S 5/04* (2013.01); *H01S 5/0607* (2013.01); *H01S 5/2027* (2013.01); *H01S 5/22* (2013.01); *H01S 5/32341* (2013.01); *H01S 2301/173* (2013.01)

(58) Field of Classification Search
CPC ............. H01S 2301/173; H01S 3/0906; H01S 3/0955; H01S 3/0959; H01S 5/3013; H01S 5/04; H01S 5/0424; H01S 5/0425; H01S 5/0607; H01S 5/2027; H01S 5/22; H01S 5/32341; H01S 5/20; H01S 5/2004; H01S 5/3211; H01S 5/34333
See application file for complete search history.

(56) References Cited

U.S. PATENT DOCUMENTS 3,602,838 A * 8/1971 Stern ......................... F21K 2/00
  117/60
5,841,802 A * 11/1998 Whiteley ............... B82Y 20/00
  372/45.01

(Continued)

OTHER PUBLICATIONS

Jing Becker et al. "Distributed feedback ridge waveguide lasers fabricated by CNP process" Microelectronic Engineering 181 (2017) pp. 29-33.*

(Continued)

*Primary Examiner* — Jessica Manno
*Assistant Examiner* — Delma R Forde
(74) *Attorney, Agent, or Firm* — LaBatt, LLC

(57) ABSTRACT

A device is provided in which a light emitting semiconductor structure is excited by an electron beam that impacts a region of a lateral surface of the light emitting semiconductor structure at an angle to the normal of the lateral surface that is non-zero. The non-zero angle can be configured to cause excitation in a desired region of the light emitting semiconductor structure. The device can include wave guiding layer(s) and/or other features to improve the light generation and/or operation of the device.

20 Claims, 9 Drawing Sheets

(51) Int. Cl.
*H01S 5/20* (2006.01)
*H01S 5/22* (2006.01)

(56) References Cited

U.S. PATENT DOCUMENTS

| | | | |
|---|---|---|---|
| 7,498,182 B1* | 3/2009 | Sampath | B82Y 20/00 438/21 |
| 7,590,161 B1* | 9/2009 | Hug | G01J 3/10 372/69 |
| 8,106,379 B2* | 1/2012 | Bowers | B82Y 20/00 257/14 |
| 8,964,796 B2 | 2/2015 | Wunderer et al. | |
| 9,105,792 B2 | 8/2015 | Jain et al. | |
| 2002/0080836 A1* | 6/2002 | Hwang | H01S 5/18375 372/45.01 |
| 2005/0226302 A1 | 10/2005 | Lutgen | |
| 2006/0114961 A1 | 6/2006 | Manni | |
| 2006/0163998 A1* | 7/2006 | Tiberi | B82Y 20/00 313/477 R |
| 2009/0022192 A1 | 1/2009 | Itoh et al. | |
| 2010/0288341 A1* | 11/2010 | Kim | B82Y 20/00 136/252 |
| 2011/0253975 A1 | 10/2011 | Shatalov et al. | |
| 2013/0215921 A1 | 8/2013 | Cohen et al. | |
| 2013/0250986 A1* | 9/2013 | Wunderer | H01S 5/02461 372/36 |
| 2014/0072009 A1* | 3/2014 | Wunderer | H01S 5/02461 372/45.012 |
| 2014/0239312 A1 | 8/2014 | Shatalov et al. | |
| 2014/0369367 A1* | 12/2014 | Wunderer | H01S 5/3401 372/5 |
| 2015/0243841 A1 | 8/2015 | Shatalov et al. | |
| 2016/0126409 A1* | 5/2016 | Sannikov | H01L 33/06 345/82 |

OTHER PUBLICATIONS

M. Sugo et al. "Development of 1.02 μm pump laser diodes" OSA, 1996, vol. 5 pp. 101-104.*
International Application No. PCT/US2016/029489, International Search Report and Written Opinion, dated Jul. 28, 2016, 11 pages.

* cited by examiner

ELECTRON BEAM PUMPING FOR LIGHT EMISSION

REFERENCE TO RELATED APPLICATIONS

The current application claims the benefit of U.S. Provisional Application No. 62/153,061, which was filed on 27 Apr. 2015, and which is hereby incorporated by reference.

TECHNICAL FIELD

The disclosure relates generally to light emission, and more particularly, to inducing light emission via electron beam pumping.

BACKGROUND ART

Developing solid-state emitters (e.g., lasers) that emit radiation in the ultraviolet (UV) range presents a challenging engineering problem. Factors limiting the performance of such devices include the efficiency in p-type doping and carrier injection, as well as material quality. Frequency-doubled or -quadrupled lasers enable shortened wavelength output, but require precise alignment of optical components. Additionally, such lasers are limited to very specific wavelengths, and often operate only in pulsed mode. Other UV lasers, such as excimer lasers, are limited to specific wavelengths, are very bulky and immobile, inefficient and expensive, and also operate only in pulsed mode.

Epitaxial growth of high-quality aluminum gallium nitride (AlGaN) continues to be challenged by a lack of matched substrates. Threading dislocations that result from heteroepitaxy are responsible for leakage currents, trapping effects, and may adversely affect device reliability. AlN nucleation conditions have been determined to be important for reliability of the device when grown on silicon carbide (SiC) substrates.

SUMMARY OF THE INVENTION

Aspects of the invention provide a device in which a light emitting semiconductor structure is excited by an electron beam that impacts a region of a lateral surface of the light emitting semiconductor structure at an angle to the normal of the lateral surface that is non-zero. The non-zero angle can be configured to cause excitation in a desired region of the light emitting semiconductor structure. The device can include wave guiding layer(s) and/or other features to improve the light generation and/or operation of the device.

A first aspect of the invention provides a device comprising: a light emitting semiconductor structure having a lateral surface; and means for directing an electron beam over at least a portion of the lateral surface of the light emitting semiconductor structure, wherein the electron beam forms a non-zero angle with the normal of the lateral surface.

A second aspect of the invention provides a device comprising: a light emitting semiconductor structure comprising: an active region configured to emit light; and a first wave guiding structure covering at least a portion of a first lateral surface of an active region; and means for directing an electron beam onto an area of an outer lateral surface of the light emitting semiconductor structure, wherein the electron beam forms a non-zero angle with the normal of the outer lateral surface.

A third aspect of the invention provides a light emitting device comprising: a light emitting semiconductor structure having a lateral surface; and an electron beam pump source mounted to emit an electron beam that impacts a region of the lateral surface of the light emitting semiconductor structure, wherein the electron beam forms a non-zero angle with the normal of the lateral surface.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 1A shows a device including electron beam deposition according to the prior art, while

FIG. 9A shows an illustrative light emitting semiconductor structure including a discharge structure with protrusions according to an embodiment, while

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a device in which a light emitting semiconductor structure is excited by an electron beam that impacts a region of a lateral surface of the light emitting semiconductor structure at an angle to the normal of the lateral surface that is non-zero. The non-zero angle can be configured to cause excitation in a desired region of the light emitting semiconductor structure. The device can include wave guiding layer(s) and/or other features to improve the light generation and/or operation of the device.

As used herein, unless otherwise noted, the term "set" means one or more (i.e., at least one) and the phrase "any solution" means any now known or later developed solution. It is understood that, unless otherwise specified, each value is approximate and each range of values included herein is inclusive of the end values defining the range. As used herein, unless otherwise noted, the term "approximately" is inclusive of values within +/− ten percent of the stated value, while the term "substantially" is inclusive of values within +/− five percent of the stated value. Unless otherwise stated, two values are "similar" when the smaller value is within twenty-five percent of the larger value, and two values are "distinct" when the smaller value differs from the larger value by at least ten percent. A value, y, is on the order of another value, x, when the value y satisfies the formula $0.1x \leq y \leq 10x$.

As also used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength +/− five nanometers) by an active region of an optoelectronic device during operation of the device. For a given layer, the wavelength can be measured in a material of consideration and can depend on a refractive index of the material. Additionally, as used herein, a contact is considered "ohmic" when the contact exhibits close to linear current-voltage behavior over a relevant range of currents/voltages to enable use of a linear dependence to approximate the current-voltage relation through the contact region within the relevant range of currents/voltages to a desired accuracy (e.g., +/− one percent).

Figure 1A:
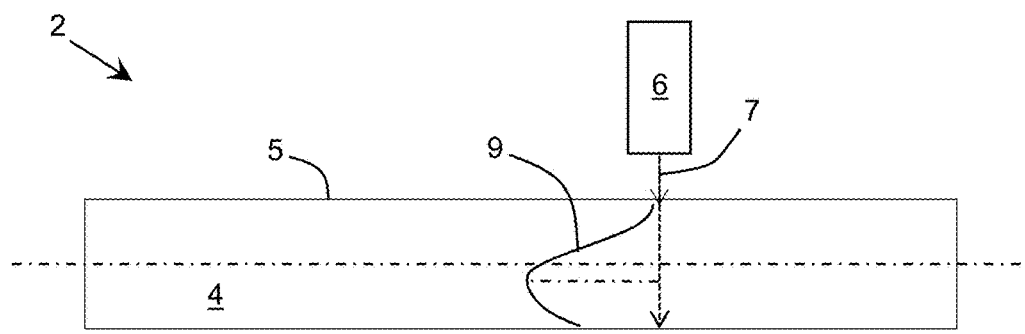
Figure 1B:
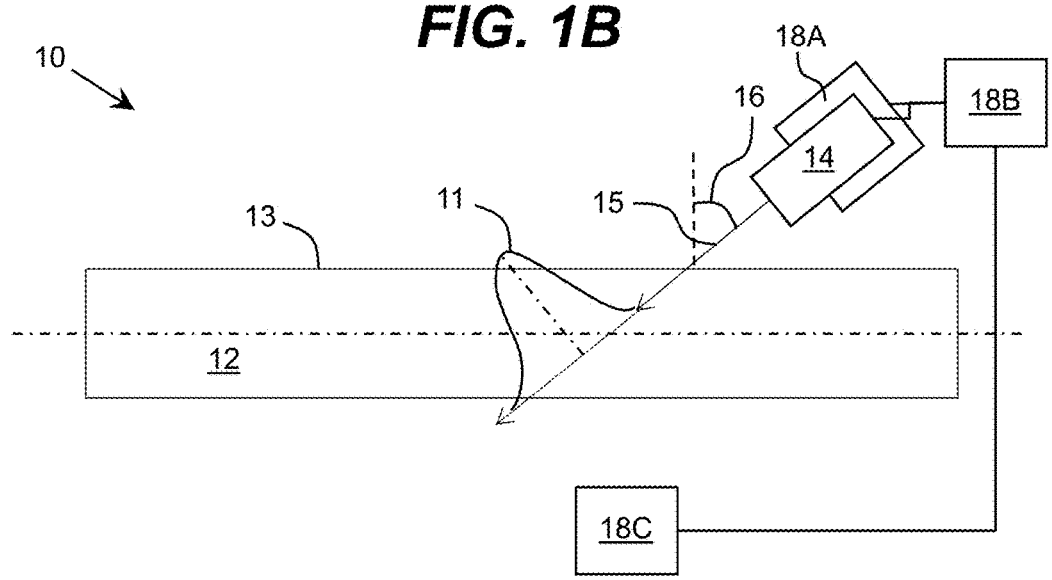
FIG. 1B shows an illustrative device including electron beam deposition according to an embodiment.

Turning to the drawings, FIG. 1A shows a device 2 including electron beam 7 deposition according to the prior art, while FIG. 1B shows an illustrative device 10 including electron beam 15 deposition according to an embodiment. As illustrated in FIG. 1A, the device 2 includes a light emitting semiconductor structure 4 and an electron beam pump source 6. During operation of the device 2, the electron beam pump source 6 emits an electron beam 7 that impacts a lateral surface 5 of the light emitting semiconductor structure 4 normal (perpendicular) to the lateral surface 5. The electron beam 7 induces generation of electron-hole pairs at a rate having a profile 9. As illustrated, depending on the attributes of the light emitting semiconductor structure 4, the electron beam 7 may exit the light emitting semiconductor structure 4 while electron-hole pairs are still being generated.

In contrast, in the device 10 shown in FIG. 1B, an electron beam 15 generated by an electron beam pump source 14 contacts a lateral surface 13 of a light emitting semiconductor structure 12 at an angle 16 to the normal of the lateral surface 13. The electron beam 15 pumping of the light emitting semiconductor structure 12 generates electron-hole pairs at a rate having a profile 11, which results in light being emitted therefrom. As illustrated, significantly more of the profile 11 can be included within the semiconductor structure 12 when the electron beam 15 impacts the lateral surface 13 at an angle 16 to the normal as opposed to normal to the surface as in the prior art.

The semiconductor structure 12 can comprise any type of light emitting solid state semiconductor structure. For example, the semiconductor structure 12 can be a light emitting structure that emits predominantly in spontaneous emission. The light emitted by the light emitting semiconductor structure 12 can have a peak wavelength in any range of wavelengths. In a more particular illustrative embodiment, the peak wavelength is below 300 nanometers. In an illustrative embodiment, the light is laser light. While the electron beam 15 is shown forming a particular angle 16 with the normal of the lateral surface 13, it is understood that this angle is only illustrative of various possible angles.

In an embodiment, the device 10 can include a mounting structure 18A to hold the electron beam pump source 14 in a desired relationship (e.g., distance, location, and angle) with respect to the lateral surface 13 of the light emitting semiconductor structure 12. The mounting structure 18A can support the electron beam pump source 14 and/or light emitting semiconductor structure 12 such that the electron beam 15 directly contacts the lateral surface 13 at the desired location and angle 16 after being emitted by the electron beam pump source 14. However, it is understood that this is only illustrative. To this extent, it is understood that a device 10 can be configured to cause the beam 15 to impact the lateral surface 13 at a desired angle 16 using any of various solutions. For example, the device 10 can include one or more mirrors or other wave guiding structures, which can be utilized to redirect an electron beam 15 emitted by the electron beam pump source 14 to impact the lateral surface 13 at a desired location and/or angle 16. In either case, the device 10 can include a mounting structure 18A, which enables relative movement between the electron beam pump source 14 (and/or the wave guiding structure(s) when included) and the light emitting semiconductor structure 12 to allow the location and/or angle at which the electron beam 15 impacts the lateral surface 13, and/or a distance between the lateral surface 13 and the electron beam pump source 14 to be selectively varied.

To this extent, the device 10 is further shown including a control component 18B, which can operate the electron beam pump source 14 and/or the mounting structure 18A to result in generation of light by the light emitting semiconductor structure 12 having one or more selectable attributes. For example, the control component 18B can change the angle and/or location of the electron beam 15 (e.g., by operating the mounting structure 18A) according a predetermined scanning sequence for controlling the light radiation intensity and/or pattern. Similarly, the control component 18B can adjust an intensity of the electron beam 15 emitted by the electron beam pump source 14 as a function of time to control the light radiation intensity and/or pattern.

The device 10 can further include a feedback component 18C, which can include one or more sensors positioned to detect the light emitted by the light emitting semiconductor structure 12. The control component 18B can adjust an intensity, location, angle, and/or the like, of the electron beam 15 based on the feedback provided by the feedback component 18C, e.g., to achieve a target radiation output, to compensate for changes in temperature or aging of the light emitting semiconductor structure 12, and/or the like. In an illustrative application, the control component 18B can adjust the electron beam intensity or deposition angle to achieve a target objective of the emitted light (e.g., laser). For example, the target objective can include achieving a disinfection dose over a target surface or volume, chemical changes over the target surface or volume, as well as a necessary distribution of radiated intensity over the target surface or volume.

While the device 10 is primarily shown and described herein as including one or more movable/rotatable electron beam pump source(s) 14, it is understood that a device 10 can include a sub-system which enables the light emitting semiconductor structure 12 to be moved/rotated. In this case, the light emitting semiconductor structure 12 can be rotated continuously or in some fixed angle positions. Additionally, the feedback component 18C can provide feedback to the control component 18B, which can enable the control component 18B to provide, for example, a maximum light output.

The angle 16 and energy of the electron beam 15 can affect a peak penetration of the electron beam 15 into the light emitting semiconductor structure 12. The peak penetration of the electron beam 15 can affect a depth of the light emitting semiconductor structure 12 at which electron-hole pairs are excited at a peak rate. In an embodiment, a device 10 can enable one or more electron beams 15 to contact the lateral surface 13 of the light emitting semiconductor structure 12 with differing and/or selectable energies and/or angles 16.

Figure 2:
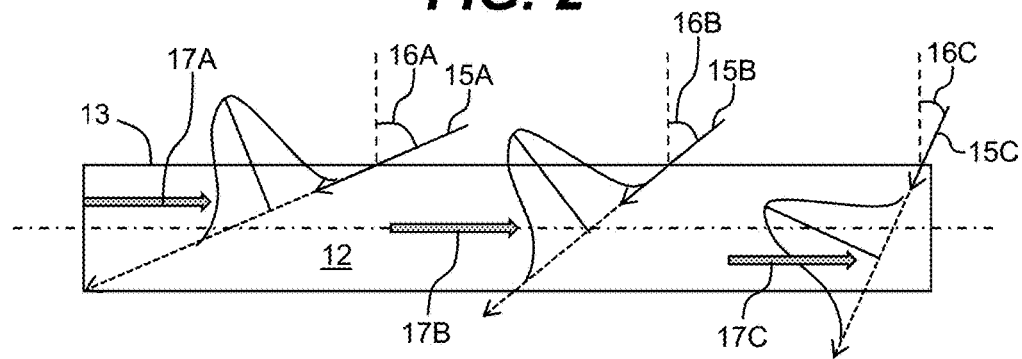
FIG. 2 shows an illustrative light emitting semiconductor structure being concurrently impacted by three electron beams according to an embodiment.

For example, FIG. 2 shows an illustrative light emitting semiconductor structure 12 being concurrently impacted by three electron beams 15A, 15B, 15C at corresponding angles 16A, 16B, 16C to the normal of the lateral surface 13 of the light emitting semiconductor structure 12 according to an embodiment. In this case, each of the electron beams 15A-15C can have approximately the same energy, but different angles 16A-16C. In particular, the electron beam 15A impacts the lateral area 13 at an angle 16A to the normal that is greater than the angles 16B, 16C for the electron beams 15B, 15C, while the electron beam 15C impacts the lateral area 13 at the smallest angle 16C to the normal of the three electron beams 15A-15C.

The different angles 16A-16C can result in the respective electron beams 15A-15C penetrating the light emitting semiconductor structure 12 to different depths. As illustrated by the arrows 17A-17C, each electron beam 15A-15C can excite electron-hole pairs located at a different depth within the light emitting semiconductor structure 12. While not shown for clarity, it is understood that the depth at which each electron beam 15A-15C can excite electron-hole pairs also can be affected by adjusting the energy of the electron beams 15A-15C. For example, multiple electron beams of differing energies can impact the lateral surface 13 at approximately the same angle to the normal, thereby resulting in electron-hole pairs being excited at different depths within the light emitting semiconductor structure 12. In particular, the electron beam having the lowest energy will excite electron-hole pairs closer to the lateral surface 13, while the electron beam having the highest energy will excite electron-hole pairs furthest from the lateral surface 13.

Figure 3:
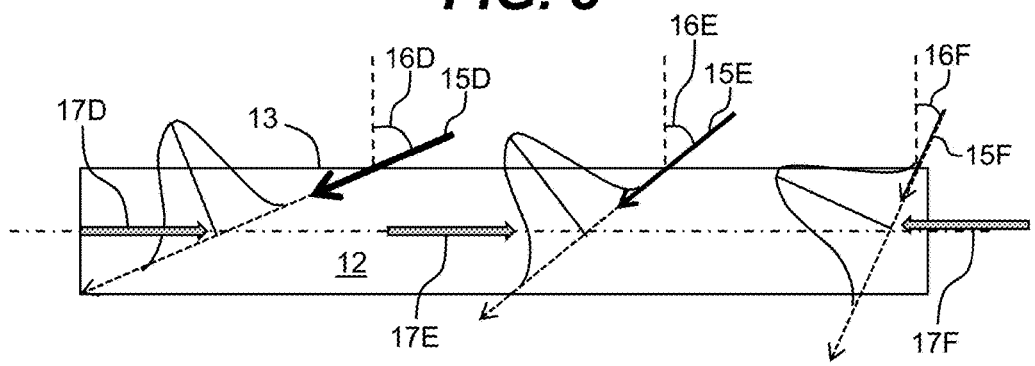
FIG. 3 shows an illustrative light emitting semiconductor structure being concurrently impacted by three electron beams according to another embodiment.

In an embodiment, a device described herein includes multiple electron beams of differing energies impacting the lateral surface 13 of the light emitting semiconductor structure 12 at differing angles to provide an approximately fixed depth of penetration for the electron beams. To this extent, FIG. 3 shows an illustrative light emitting semiconductor structure 12 being concurrently impacted by three electron beams 15D, 15E, 15F at corresponding angles 16D, 16E, 16F to the normal of the lateral surface 13 of the light emitting semiconductor structure 12 according to an embodiment. As illustrated by the varying thicknesses representing each electron beam 15D-15F, the electron beam 15D can have the highest energy, while the electron beam 15F has the lowest energy. Furthermore, the electron beam 15D impacts the lateral surface 13 at the largest angle 16D to the normal, while the electron beam 15F impacts the lateral surface 13 at the smallest angle 16F to the normal.

In an embodiment, the relative energies of the electron beams 15D-15F and the differing angles 16D-16F are selected to result in approximately the same penetration of the light emitting semiconductor structure 12 by each of the electron beams 15D-15F and excitation of electron-hole pairs at approximately the same depth of the light emitting semiconductor structure 12 as illustrated by the arrows 17D-17F. As illustrated, the depth can correspond to an approximate midpoint of the total depth of the light emitting semiconductor structure 12. However, it is understood that this is only illustrative, and the electron beams 15D-15F can be configured to concurrently penetrate to any depth within the light emitting semiconductor structure 12. Furthermore, it is understood that the relative energies and differing angles of multiple electron beams can be configured to concurrently penetrate the light emitting semiconductor structure 12 at two or more distinct depths within the light emitting semiconductor structure 12. To this extent, a subset of the electron beams can be configured to penetrate the light emitting semiconductor structure 12 to a first depth, while a second subset of the electron beams can be configured to concurrently penetrate the light emitting semiconductor structure 12 to a second depth distinct from the first depth.

Figure 4:
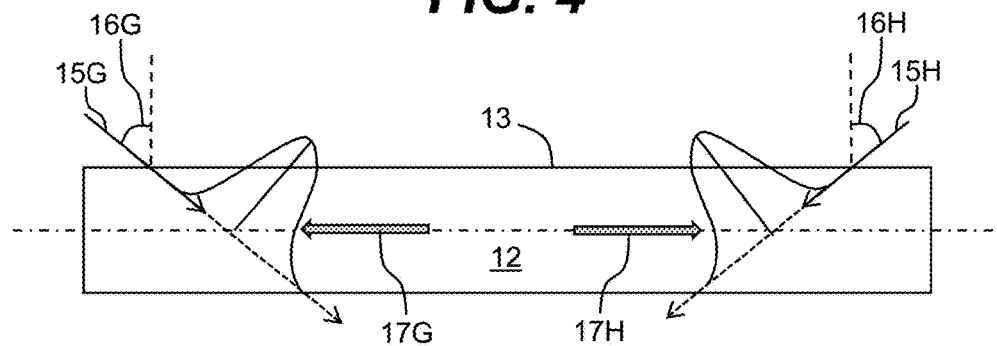
FIG. 4 shows an illustrative light emitting semiconductor structure being concurrently impacted by two electron beams according to another embodiment.

It is understood that a device described herein can include electron beams impacting the lateral surface 13 of the light emitting semiconductor structure 12 from any combination of various azimuthal angles. For example, FIG. 4 shows an illustrative light emitting semiconductor structure 12 being concurrently impacted by two electron beams 15G, 15H at corresponding angles 16G, 16H to the normal of the lateral surface 13 of the light emitting semiconductor structure 12 according to an embodiment. In this case, the angles 16G, 16H can have opposite signs, indicating that the directions of the electron beams 15G, 15H are impacting the lateral surface 13 at azimuthal angles opposite of one another.

While both beams 15G, 15H are shown aligned with a plane of the drawing, it is understood that a device described herein can have beams impacting the lateral surface 13 from two or more of any combination of azimuthal angles measured along a plane extending perpendicular to the plane of the drawing. It is understood that while the electron beams 15G, 15H are shown exciting electron-hole pairs at approximately the same depth of the light emitting semiconductor structure 12 as illustrated by the arrows 17G, 17H, it is understood that the electron beams 15G, 15H can be configured to excite electron-hole pairs at distinct depths of the light emitting semiconductor structure 12.

Regardless, as illustrated in FIG. 4, the electron beams 15G, 15H can be directed towards each other. In this case, electron beams 15G, 15H can form a high concentration of electrons within an area of the light emitting semiconductor structure 12 affected by both of the electron beams 15G, 15H. Such a configuration allows for a high electron-hole pair generation rate at a position where the electron beams 15G, 15H intersect, while reducing the electron-hole par generation rate at other locations within the semiconductor structure 12. In an embodiment, the electron beam intersection position coincides with an active region in the semiconductor structure 12.

An electron beam described herein can have any of various cross-sectional shapes perpendicular to the symmetry axis. For example, an electron beam can have an elliptical (e.g., circular), a rectangular (e.g., square), parallelogram, and/or the like, cross-section. In an embodiment, the relative location of an electron beam emitter and a lateral surface of a light emitting semiconductor structure can be selected to cause the electron beam to impact a significant portion of the lateral surface. In an embodiment, the electron beam is configured so that substantially all of the electron beam impacts the lateral surface without extending beyond the light emitting semiconductor structure, while providing coverage of a significant portion of the lateral area.

Figure 5:
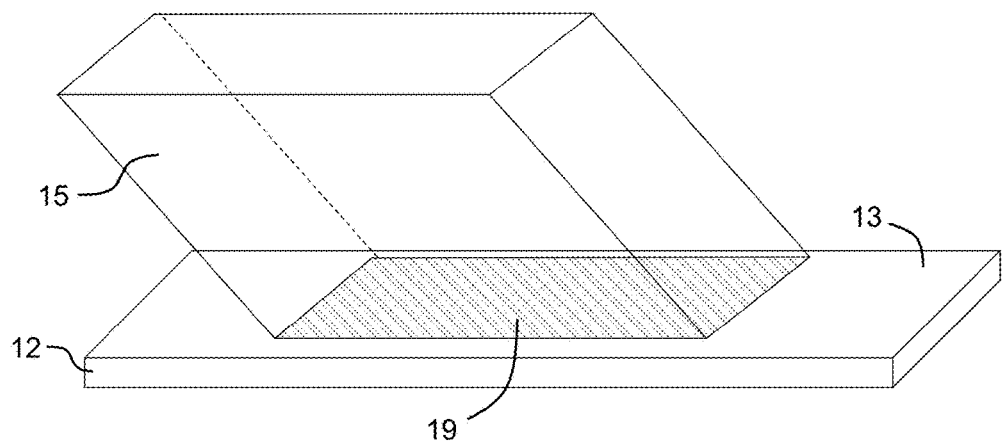
FIG. 5 shows a three-dimensional view of an illustrative light emitting semiconductor structure being impacted by an electron beam according to an embodiment.

To this extent, FIG. 5 shows a three-dimensional view of an illustrative light emitting semiconductor structure 12 being impacted by an electron beam 15 according to an embodiment. Various attributes of the electron beam 15 can be selected based on the dimensions and shape of the lateral area 13. In this case, the lateral area 13 of the light emitting semiconductor structure 12 and the cross-section (perpendicular to the path of the beam) of the electron beam 15 are both rectangular. As illustrated, the electron beam 15 impacts the lateral area 13 in a centrally located rectangular region 19, which is elongated from the cross-section of the electron beam 15 due to the angle of the electron beam 15 with respect to the normal of the lateral area 13. In a more particular illustrative embodiment, the lateral area 13 and the rectangular region 19 can have a width on the order of 20 microns and a length on the order of 500 or even 1000 microns, with the dimensions of the lateral area 13 exceeding the dimensions of the rectangular region 19. However, it is understood that these dimensions are only illustrative and any of various dimensions can be utilized based on the light emitting properties of the device. Regardless, the dimensions of the region 19 can be selected to provide a high (e.g., greater than 40%) surface coverage of the lateral area 13.

As discussed herein, the light emitting semiconductor structure 12 emits light, such as laser light, when excited by the electron beam 15. In an illustrative embodiment, the light emitting semiconductor structure 12 is designed as an edge-type emitting laser, which is pumped by the electron beam 15. In this case, the laser heterostructure 12 can include cladding layer(s), waveguide layer(s), and/or a multiple quantum well (MQW) active region, to increase optical modal confinement and/or to achieve high modal gain. During operation of the corresponding device, generation of electron-hole pairs and subsequently photons, through recombination of these, is enabled by using the electron beam 15 to perform high energy electron pumping, rather than recombination of electron-hole pairs in a p-/n-junction device. In this case, the light emitting semiconductor structure 12 can be implemented without a p-doped region. In a still more particular embodiment, the light emitting semiconductor structure 12 is formed of high band gap materials, such as an AlGaN-based heterostructure. The lack of requirement for a p-doped region can be attractive in high band gap materials since the activation energy of p-type dopants increases with the band gap and hinders the creation of high hole concentrations. As a p-type layer proximate the active region typically results in significant absorption loss, the lack of such a layer enables the device to exhibit comparatively very low optical loss.

Figure 6:
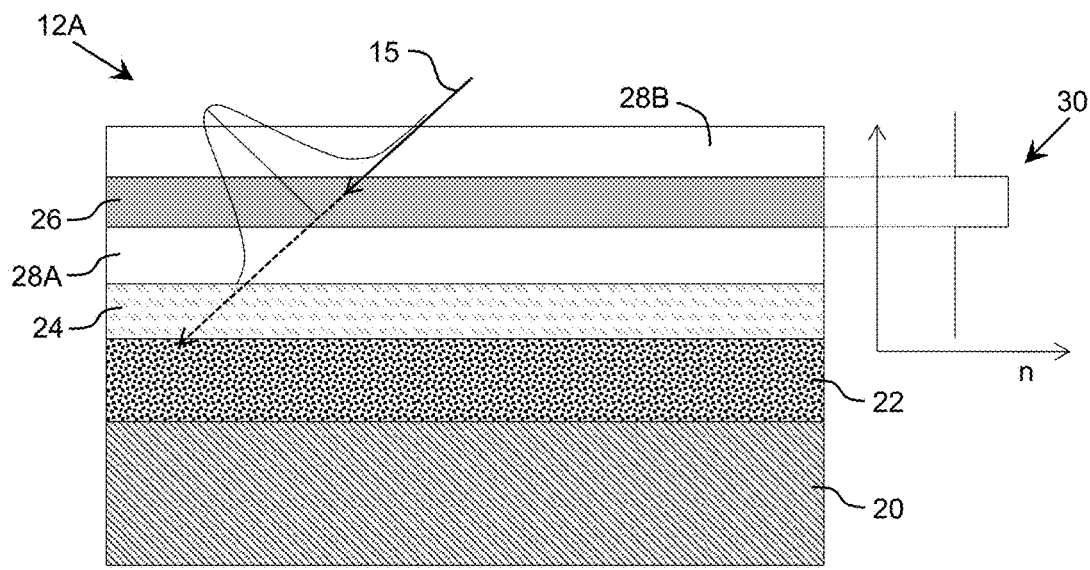
FIG. 6 shows a schematic structure of an illustrative light emitting semiconductor structure according to an embodiment.

FIG. 6 shows a schematic structure of an illustrative light emitting semiconductor structure 12A according to an embodiment. In a more particular illustrative embodiment, the light emitting semiconductor structure 12A is a group III-V materials based heterostructure, in which some or all of the various layers are formed of elements selected from the group III-V materials system. In a still more particular illustrative embodiment, the various layers of the light emitting semiconductor structure 12A are formed of group III nitride based materials. Group III nitride materials comprise one or more group III elements (e.g., boron (B), aluminum (Al), gallium (Ga), and indium (In)) and nitrogen (N), such that $B_wAl_xGa_yIn_zN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

Regardless, the structure 12A includes a substrate 20 on which a stress and dislocation relieving structure 24 can be located (e.g., epitaxially grown or otherwise affixed thereto). The substrate 20 can comprise any type of material suitable for growth of one or more layers thereon. An embodiment of the substrate 20 is formed of sapphire. However, it is understood that the substrate 20 can be formed of any suitable material including, for example, silicon carbide (SiC), diamond, silicon (Si), bulk GaN, bulk AlN, bulk or a film of AlGaN, bulk or a film of BN, AlON, lithium gallate ($LiGaO_2$), lithium aluminate ($LiAlO_2$), lithium niobate ($LiNbO_3$), aluminum oxinitride ($AlO_xN_y$), $MgAl_2O_4$, zinc oxide (ZnO), GaAs, Ge, or another suitable material.

The stress and dislocation relieving structure 24 can comprise, for example, a semiconductor heterostructure of multiple layers. In an embodiment, the stress and dislocation relieving structure 24 contains interlayers and/or semiconductor superlattices characterized by semiconductor layers with varying composition and thickness. In addition, the stress and dislocation relieving structure 24 may contain layers of graded composition to further relieve the stress. The stress and dislocation relieving structure 24 can further comprise sublayers formed utilizing epitaxial lateral overgrowth, which includes forming sublayers with masking material containing openings for epitaxial lateral overgrowth. Furthermore, a surface of the substrate 20 can be substantially flat or patterned using any solution. Further details of an illustrative growth technique for an illustrative stress and dislocation relieving structure 24 are described in U.S. patent application Ser. No. 13/647,902, which was filed on 9 Oct. 2012, and which is hereby incorporated by reference.

The light emitting semiconductor structure 12A also can include a buffer layer 22, which can be epitaxially grown directly on the substrate 20. Such a buffer layer 22 can be used to relieve tensile and lattice mismatch stresses associated with subsequent growth on a lattice mismatched substrate 20. In addition, the buffer layer 22 can further mitigate stresses associated with a mismatch in thermal expansion coefficients. In an embodiment, the buffer layer 22 can comprise a AlN layer containing cavities. Further discussion of an illustrative buffer layer 22 is further described in U.S. patent application Ser. No. 14/628,281, which was filed 22 Feb. 2015, and which is hereby incorporated by reference.

The light emitting semiconductor structure 12A includes an active region 26, which is configured to emit light when excited by the electron beam 15. In an embodiment, the active region 26 comprises a series of alternating quantum wells and barriers. In a more particular embodiment, the active region 26 is formed of group III nitride materials, such as $In_yAl_xGa_{1-x-y}N$, $Ga_zIn_yAl_xB_{1-x-y-z}N$, an $Al_xGa_{1-x}N$ semiconductor alloy, or the like.

Additionally, the light emitting semiconductor structure 12A is shown including a pair of wave-guiding layers 28A, 28B located on opposing surfaces of the active region 26. Each wave-guiding layer 28A, 28B can completely cover the corresponding surface of the active region 26. As illustrated by the plot 30, a refractive index, n, for each of the wave-guiding layers 28A, 28B is lower than a refractive index (index of refraction) for the active region 26. However, each wave-guiding layer 28A, 28B can be configured differently, be formed of different materials, be manufactured using different approaches, and/or the like. In an illustrative embodiment, a refractive index of each wave-guiding layer 28A, 28B is at least one percent lower than a refractive index of the active region 26. Regardless, the refractive indexes of the wave-guiding layers 28A, 28B can be the same or differ from each other.

In an embodiment, the wave-guiding layer 28A comprises a group III nitride layer having a higher aluminum content than that of the active region 26 (e.g., a molar fraction of at least 0.6 in an embodiment). For example, an illustrative wave-guiding layer 28A can be composed of aluminum nitride, $Al_xGa_{1-x}N$, where x is selected to provide a refractive index lower than the refractive index of the active region 26, and/or the like, which can be epitaxially grown on the stress and dislocation relieving structure 24. The wave-guiding layer 28A can be relatively thick, e.g., at least one micron thick in an embodiment. In an embodiment, the wave-guiding layer 28B comprises a wide band gap semiconductor or a dielectric layer, which can be deposited over the active region 26. For example, the dielectric layer can be formed of any low refractive index material with low ultraviolet absorption, such as for example, fused silica, amorphous $Al_2O_3$, diamond, sapphire, zinc oxide, magnesium fluoride, and/or the like.

During fabrication of a wave-guiding layer 28A, 28B, an amount of scattering which will occur at an interface between the wave-guiding layer 28A, 28B and the active region 26 should be considered. In particular, a fabrication technique should be selected to result in a small (e.g., minimum) amount of scattering at the interface between the wave-guiding layer 28A, 28B and the active region 26. In an embodiment, a low amount of scattering can be achieved through the use of an epitaxial growth technique with low dislocation density and smooth surface morphology. Growth parameters for achieving good surface morphology can include varying a V/III ratio, temperature, and/or other growth parameters, during growth of the wave-guiding layer 28A, 28B and the active region 26.

As discussed with respect to the wave-guiding layer 28B, it is desirable to minimize absorption of the electron beam 15 by the wave-guiding layer 28B. In an embodiment, one or more regions of the active region 26 are not covered by the wave-guiding layer 28B. For example, during fabrication, one or more regions of the wave-guiding layer 28B can be removed from the surface of the active region 26 and/or the wave-guiding layer 28B cannot be formed on one or more regions of the surface of the active region 26.

Figure 7A:
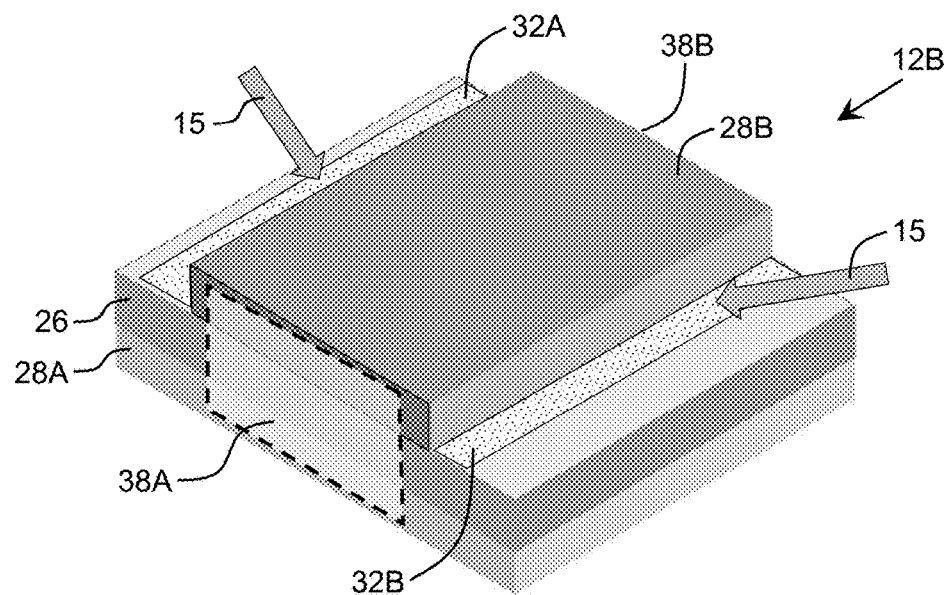
FIGS. 7A and 7B show perspective and side views, respectively, of an illustrative light emitting semiconductor structure according to an embodiment.
Figure 7B:
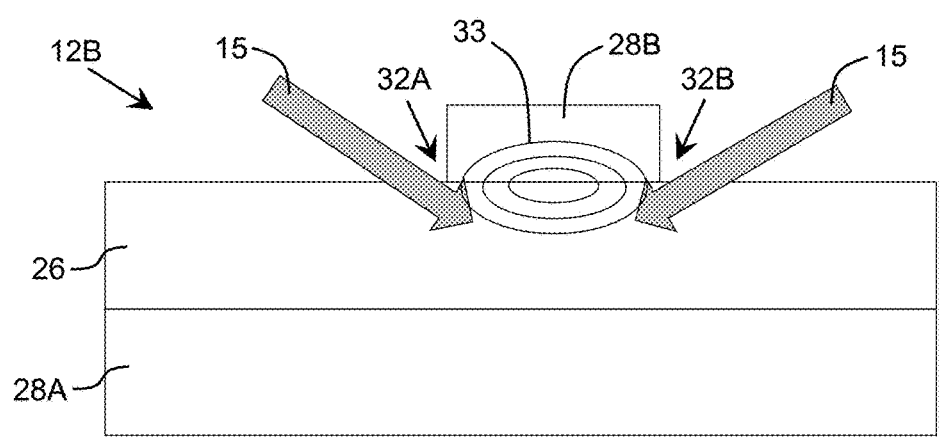

Regardless, FIGS. 7A and 7B show perspective and side views, respectively, of an illustrative light emitting semiconductor structure 12B according to an embodiment. As illustrated, the light emitting semiconductor structure 12B can include an active region 26 having a first surface entirely covered by a first wave-guiding layer 28A and a second surface only partially covered by a second wave-guiding layer 28B. While not shown for clarity, it is understood that the light emitting semiconductor structure 12B can include any combination of various other layers and/or structures described herein.

In any event, during operation of the corresponding device, one or more electron beams 15 can impact the lateral surface of the active region 26 in one or more regions 32A, 32B immediately adjacent to an edge of the second wave-guiding layer 28B. In this case, the electron beams 15 do not pass through the second wave-guiding layer 28B, but excite electron-hole pairs located in the active region 26 directly below the second wave-guiding layer 28B as indicated by the ellipses 33. As a result, the light emitting semiconductor structure 12B obtains the benefit of the second wave-guiding layer 28B without operation of the light emitting semiconductor structure 12B being adversely impacted by absorption of the electron beam 15 by the second wave-guiding layer 28B, creation of electron-hole pairs within the wave-guiding layer 28B, and/or the like. As a result, electron-hole pair creation within the active region 26 is more efficient. In addition, the light emitting semiconductor structure 12B can result in further optical confinement of the emitted light as indicated schematically by the amplitude represented by the ellipses 33.

It is understood that an angle, energy, and/or cross-section of the electron beam(s) 15 can be selected based on one or more physical attributes of the light emitting semiconductor structure 12B including, for example, lateral dimensions of the second wave-guiding layer 28B, lateral dimensions of the active region 26, a thickness of the active region 26, a size of the uncovered regions 32A, 32B of the active region 26, and/or the like. For example, an energy of the electron beam(s) 15 can be adjusted to position the electron-beam penetration of the light emitting semiconductor structure 12B such that the peak excitation occurs within the active region 26.

In an embodiment, a semiconductor structure described herein can further include one or more features to form a resonant cavity therein. For example, in FIG. 7A, the semiconductor structure 12B is shown having a front facet 38A, and can have a similar back facet 38B located on the opposing side of the semiconductor structure 12B. Each facet 38A, 38B can be optically reflective, thereby forming a resonance cavity within the semiconductor structure 12B located between the facets 38A, 38B. Furthermore, the wave-guiding layer 28B can comprise be a reflective surface to the target radiation, thereby further increasing confinement of the electron beam(s) 15 within the semiconductor structure 12B. For example, the wave-guiding layer 28B can comprise a Bragg reflector or a metallic reflective layer.

The resonance cavity can result in recirculation of light between the two facets 38A, 38B. In such an embodiment, the electron beam(s) 15 can be located between the facets 38A, 38B at least a micron or more from the sides on which the facets 38A, 38B are located. Regardless, the electron beam(s) 15 can be located to avoid damaging the reflective properties of the facets 38A, 38B. In an embodiment, one facet, such as the back facet 38B, can be highly reflective, while the other facet, such as the front facet 38A, can be partially reflective and partially transmitting, with the reflectance exceeding the transmittance of the facet 38A.

In an embodiment, a light emitting semiconductor structure described herein can include one or more discharge structures. The discharge structure can be utilized to remove excess electric charge from the light emitting semiconductor structure, which can result from deposition of the electron beam(s) 15. The discharge structure can be in electrical contact with (e.g., located directly on at least a portion of), for example, a cladding layer, a wave-guiding layer, and/or the like, in the light emitting semiconductor structure.

Figure 8:
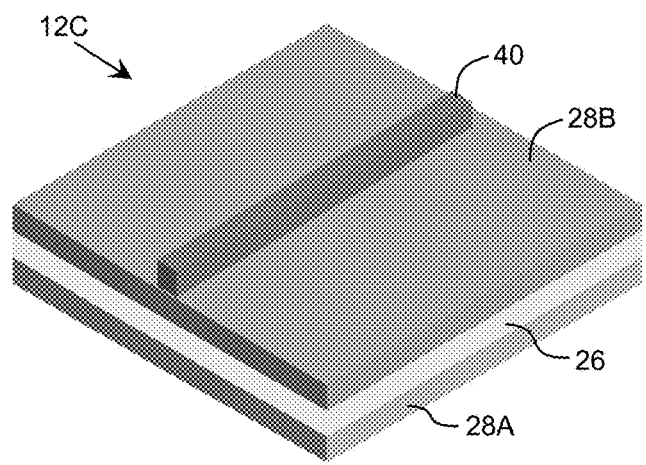
FIG. 8 shows an illustrative light emitting semiconductor structure including a discharge structure according to an embodiment.

The discharge structure can be configured to not significantly alter optical characteristics of the light emitting semiconductor structure and the corresponding device. For example, FIG. 8 shows an illustrative light emitting semiconductor structure 12C including a discharge structure 40 according to an embodiment. In this case, the discharge structure 40 comprises a metal layer located on and in electrical contact with the wave-guiding layer 28B. As illustrated, the discharge structure 40 comprises a metal strip having a small (e.g., less than ten percent) lateral area as compared to the lateral area of the wave-guiding layer 28B to have a small overall effect on the optical properties of the light emitting semiconductor structure 12C. While the discharge structure 40 is shown including a single metal strip, it is understood that a discharge structure 40 can include any number of one or more metal strips, e.g., aligned substantially parallel along a surface of the wave-guiding layer 28B. Similarly, it is understood that the discharge structure 40 can be placed on other surface(s) of the device, such as a side surface, a portion of the wave-guiding layer 28A, and/or the like. In order to contact the wave-guiding layer 28A, a portion of the wave-guiding layer 28B and the active region 26 can be etched to obtain access to the wave-guiding layer 28A for placing the discharge structure 40.

The discharge structure 40 can be made of any material (e.g., one or more metals) that forms a linear, close to linear, or essentially ohmic contact to an n-type semiconductor layer. For example, the discharge structure 40 can be formed as a layered metallic structure comprising Ti and Al, Ni and Au, with each metal having a film thickness between 1-200 nm, with the layered structure annealed. To this extent, the layer contacting the discharge structure 40, such as the wave-guiding layer 28B, can have an n-type doping, which can facilitate formation of a metal layer thereon. In an illustrative embodiment, the n-type doping has a concentration between $5 \times 10^{17}$-$10^{19}$ dopants per cubic centimeter. However, it is understood that this is only illustrative and other dopant concentrations can be utilized.

Figure 9B:
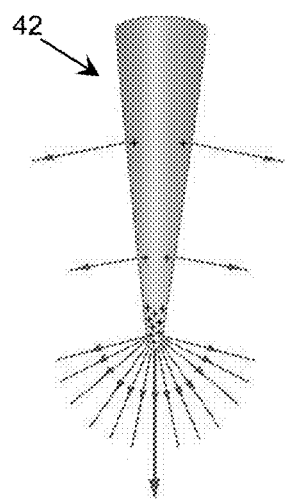
FIG. 9B shows an illustrative protrusion in more detail.
Figure 9A:
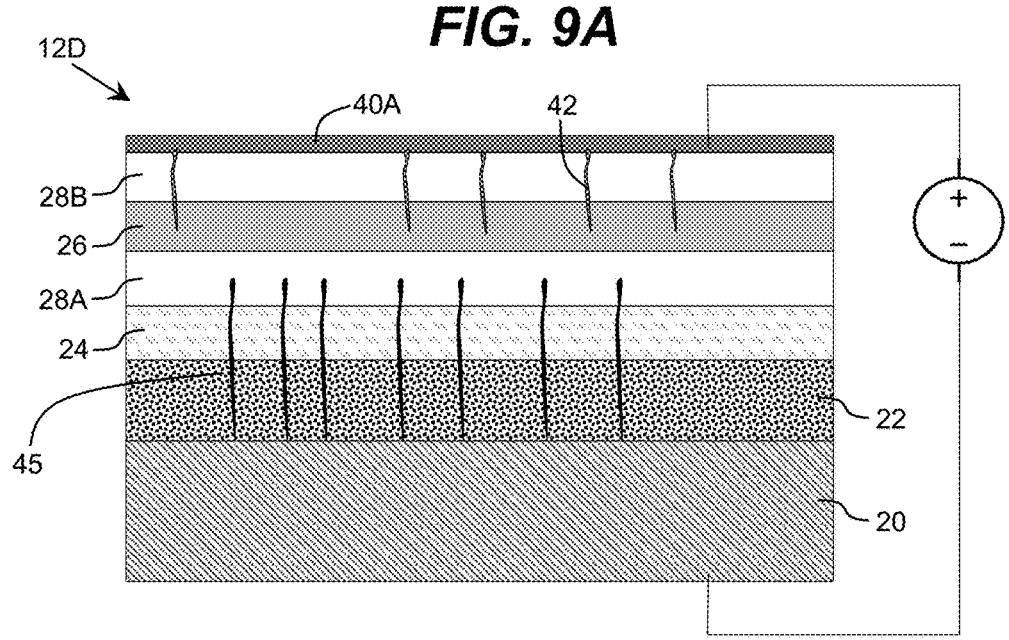

In an embodiment, the discharge structure 40 can include protrusions that penetrate one or more layers of the light emitting semiconductor structure 12C. To this extent, FIG. 9A shows an illustrative light emitting semiconductor structure 12D including a discharge structure 40A with protrusions 42 according to an embodiment. As illustrated, the protrusions 42 can extend through the wave-guiding layer 28B and partially through the active region 26. The protrusions 42 can be electrically connected to the discharge structure 40A. In an embodiment, the semiconductor structure 12D can include one or more additional protrusions 45, which are not electrically connected to the discharge structure 40A, but which can further increase removal of the excess charge from the semiconductor structure 12D.

The protrusions 42 can be fabricated using any solution. In an embodiment, the protrusions 42 can be fabricated by first etching cavities into a semiconductor layer, such as the wave-guiding layer 28B, depositing metallic material into the etched cavities, and annealing the structure. The protrusions 42 can be fabricated to contain sharp pointed edges extending generally laterally therefrom. An illustrative method of generating such protrusions 42 can comprise forming a plurality of cavities in the light emitting semiconductor structure 12D. The cavities can be separated from each other by a characteristic length scale, which can be selected based on a sheet resistance of the semiconductor layer and a contact resistance per unit length of a metal to be utilized for the protrusions 42. Subsequently, the metal can be deposited into the plurality of cavities and over an area of the light emitting semiconductor structure 12D including the plurality of cavities. The light emitting semiconductor structure 12D and the metal can be annealed using a set of conditions configured to ensure formation of a set of metal edges laterally penetrating the semiconductor layer(s) from at least one of the plurality of cavities. The set of metal edges can be conducive to at least one of: field emission or field-enhanced thermionic emission.

In an embodiment, the set of annealing conditions includes a temperature less than or equal to 850 degrees Celsius for forming a metal contact to a group III nitride semiconductor layer. In a more particular embodiment, the annealing includes rapid thermal annealing lasting for about a minute at about 600 degrees Celsius, followed by annealing at about 400 degrees Celsius for a period of approximately four to eight minutes. The annealing can be performed in an $N_2$ atmosphere. In an embodiment, the annealing is configured to control a complexity and/or direction of the metal edges laterally extending from a protrusion 42. For example, use of a relatively high temperature rapid annealing, where temperatures can reach up to approximately 850 degrees Celsius for a duration of less than a minute, can result in metal edges that extend laterally throughout the two dimensional carrier gas. In a more particular embodiment, rapid annealing lasting approximately forty-five seconds was used to obtain a desired set of lateral metal edges.

As shown in FIG. 9A, a voltage can be applied to the discharge structure 40A to collect the electrons within the light emitting semiconductor structure 12D. Alternatively, the discharge structure 40A can be connected to ground, an anode, or the like. As shown in more detail in FIG. 9B, the voltage can generate a high electric field at a tip of a protrusion 42 or an edge extending therefrom, which can attract free electrons.

It is understood that the discharge structures described herein are only illustrative. To this extent, a device described herein can include various other features that allow effective discharge excess electrons from the light emitting semiconductor structure. Such features can include one or more of: n-type doped conductive layers, metal films and/or contacts, and/or the like. In an embodiment, an n-type upper cladding layer and metal ohmic contact can be fabricated over the active region 26 to provide the discharge function. The n-type upper cladding layer can comprise a semiconductor having a band gap at most eighty percent as wide as a band gap of the active region 26. However, it is understood that this is only an example of various structural configurations which allow removal of excess of the electric charge from the semiconductor structure.

For efficient n-type doping, the aluminum molar fraction of the corresponding semiconductor layer has to be sufficiently low to allow the n-type doping. For example, the aluminum molar fraction should not exceed 0.8. However, it is beneficial for optical wave-guiding to have a high aluminum molar fraction. To this extent, the light emitting semiconductor structure can include one or more features to reduce an impact of the discharge of electrons on optical properties of the corresponding device.

Figure 10:
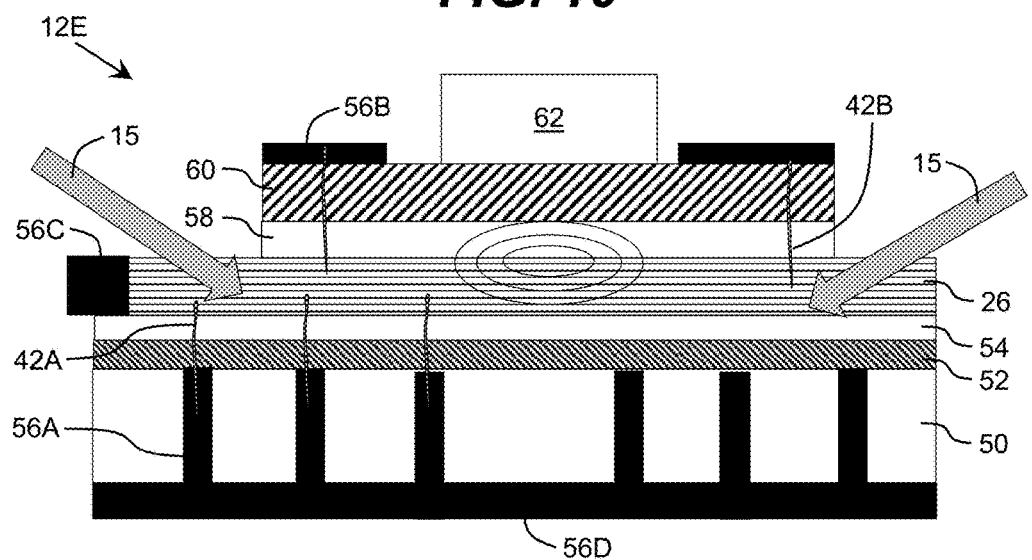
FIG. 10 shows an illustrative light emitting semiconductor structure according to an embodiment.

FIG. 10 shows an illustrative light emitting semiconductor structure 12E according to an embodiment. The light emitting semiconductor structure 12E includes a base structure 50, which can comprise one or more of a substrate, buffer layer, and stress and dislocation relieving structure described herein. The base structure 50 is followed by a first semiconductor layer 52 and a second semiconductor layer 54. In an embodiment, the first and second semiconductor layers 52, 54 are formed of group III nitride materials. While the light emitting semiconductor structure 12E is shown including two semiconductor layers 52, 54, it is understood that embodiments can include one semiconductor layer or more than two semiconductor layers.

In a more particular embodiment, the first semiconductor layer 52 can comprise a superlattice of $Al_xGa_{1-x}N/Al_yGa_{1-y}N$ with x and y ranging from 0.7 to 1, and the second semiconductor layer 54 can comprise an n-type doped AlGaN layer with a high (e.g., approximately 0.8 or higher) molar fraction of aluminum. In an embodiment, the second semiconductor layer 54 can be laterally inhomogeneous and contain regions with higher aluminum composition interspersed with the regions having relatively high gallium content. For example, the regions with high gallium molar fraction can contain an aluminum molar fraction in the range of 0.6-0.75, whereas the regions having relatively high aluminum content can contain an aluminum molar fraction in the range of 0.7-0.95. In another embodiment, the regions with higher aluminum content contain about 5% more aluminum nitride than the regions with higher gallium content. In yet another embodiment, the regions with high aluminum content have a band gap that is a few optical phonons higher than the band gap of the gallium rich regions. In still another embodiment, the regions with high aluminum content have a band gap that is one or a few thermal energies (e.g., 1-10 units of thermal energy) higher than the band gap of the gallium rich regions.

Regardless, the first and second semiconductor layers 52, 54 can have metallic protrusions 42A that extend from metallic contacts 56A extending through the base structure 50. The protrusions 42A can penetrate both the semiconductor layers 52, 54 and provide improved conductivity. Additionally, the protrusions 42A can partially penetrate an active region 26. Such protrusions 42A can significantly improve electron discharge from the semiconductor structure 12E.

As illustrated, a similar design can be used for the top wave-guiding layers of the light emitting semiconductor structure 12E. In particular, the light emitting semiconductor structure 12E is shown including a third semiconductor layer 58 and a fourth semiconductor layer 60, each of which can be designed to have similar characteristics as the second semiconductor layer 54 and the first semiconductor layer 52, respectively. Additionally, the light emitting semiconductor structure 12E is shown including metallic contacts 56B from which metallic protrusions 42B extend. The protrusions 42B can penetrate the third and fourth semiconductor layers 58, 60 and partially penetrate the active region 26. Furthermore, the light emitting semiconductor structure 12E is shown including a metallic contact 56C located on a side of the active region 26, which can be further utilized to remove excess electrons.

The light emitting semiconductor structure 12E also can include a top layer 62, which can be formed of electrically insulating aluminum nitride and can be used for wave-guiding. During operation of a corresponding device, the electron beam(s) 15 can be deposited at an angle from one or both sides of the top structure. Additionally, the light emitting semiconductor structure 12E can include a metal layer 56D located along a bottom surface of the light emitting semiconductor structure 12E. The metal layer 56D can electrically connect the protruding metallic contacts 56A, provide a reflective surface for electromagnetic radiation, act as a heat sink, and/or the like.

It is understood that other similar configurations involving metallic contacts, metallic protrusions, superlattice layers, and/or n-type doped layers having high aluminum content, are possible as long as they serve a general purpose of both containing electromagnetic mode within the active layer 26 and removing the excess of electric charge from the semiconductor heterostructure 12E. It is understood that a light emitting semiconductor heterostructure described herein can include any combination of various other features to improve electrical and/or optical characteristics of the heterostructure and corresponding device.

Figure 11A:
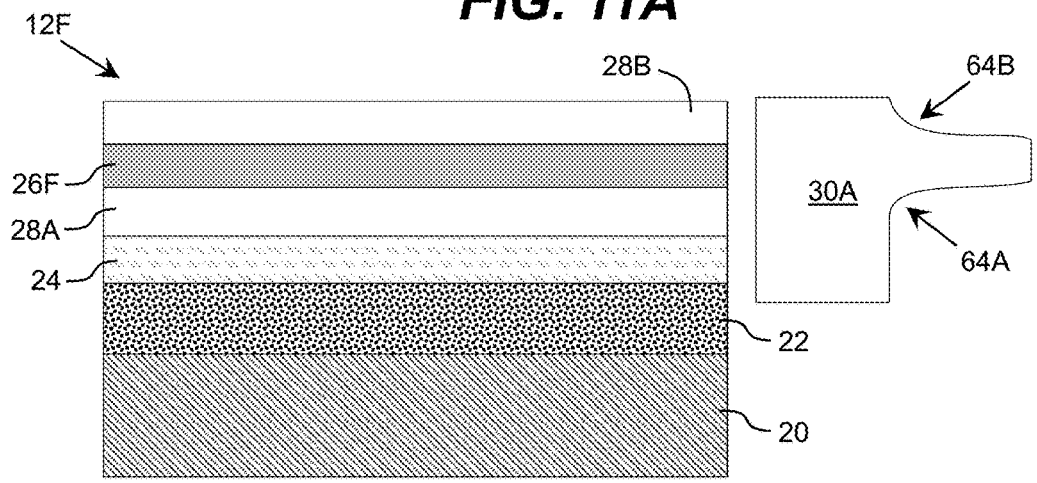
FIGS. 11A and 11B show illustrative light emitting semiconductor structures according to embodiments.
Figure 11B:
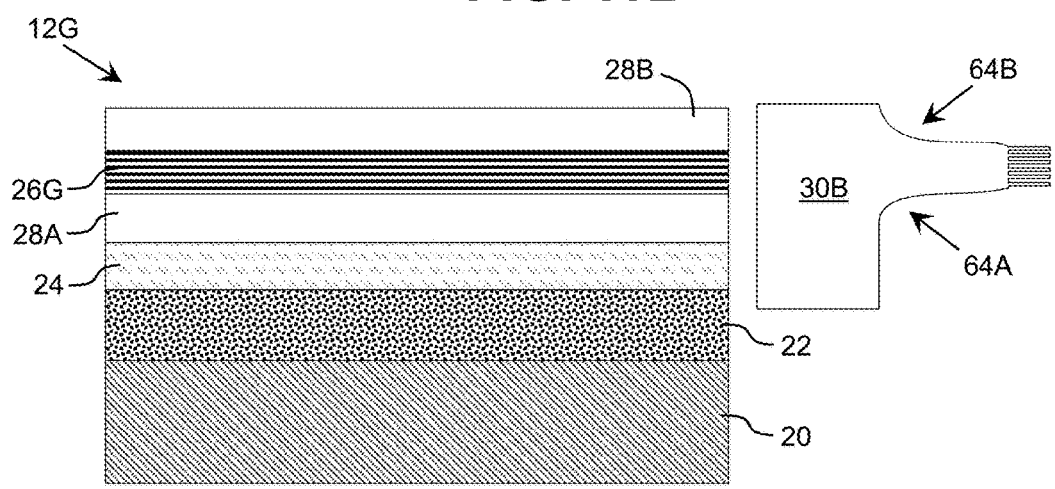

For example, FIGS. 11A and 11B show illustrative light emitting semiconductor structures 12F, 12G according to embodiments. In the light emitting semiconductor structure 12F, the active region 26F is formed of an $Al_xGa_{1-x}N$ semiconductor layer that does not contain quantum wells and barriers, but instead has a substantially constant aluminum molar fraction. In the light emitting semiconductor structure 12G, the active region 26G is contains quantum wells and barriers. In an embodiment, a thickness and/or composition of the quantum wells and barriers is optimized for the confinement of light emitted eigenmode.

As indicated by the refractive index plots 30A, 30B, respectively, the interface between the active regions 26F, 26G and the corresponding wave-guiding layers 28A, 28B can be graded. Such grading can result in a more gradual transition between the respective refractive indexes of the layers as shown by the domains 64A, 64B in each of the plots 30A, 30B. The grading can be configured to provide a smooth variation in group III nitride compositions. For example, the composition at an interface can change linearly from an aluminum nitride molar faction of about 0.7 in the active region 26F, 26G to an aluminum molar fraction of about 0.9 or greater (e.g., AlN) in the wave-guiding layers 28A, 28B. Such grading can occur of a significant thickness of approximately several tens or even a few hundreds of nanometers. As illustrated, the refractive index is a continuous function of the aluminum nitride molar fraction and decreases with an increasing aluminum nitride molar fraction.

Figure 12A:
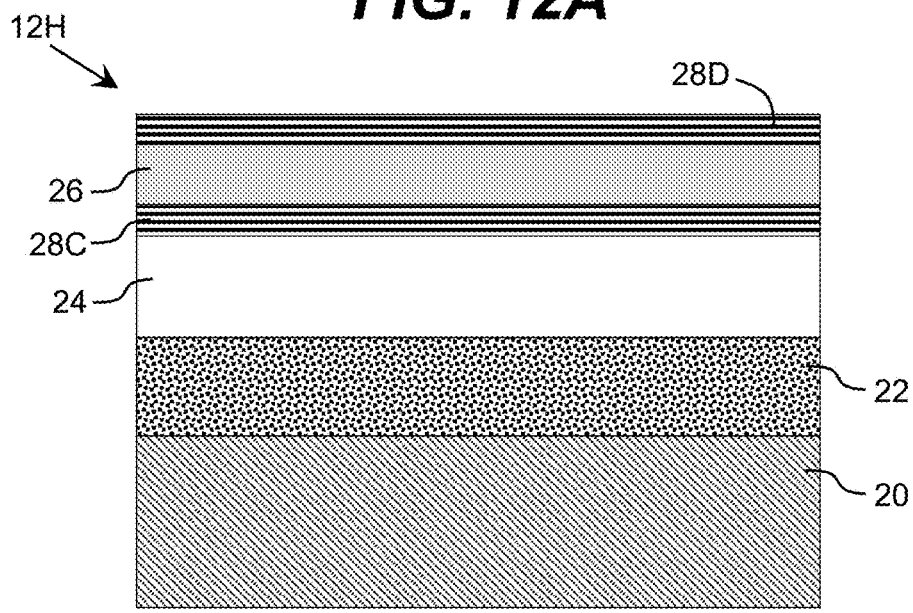
FIGS. 12A and 12B show other illustrative light emitting semiconductor structures according to embodiments.
Figure 12B:
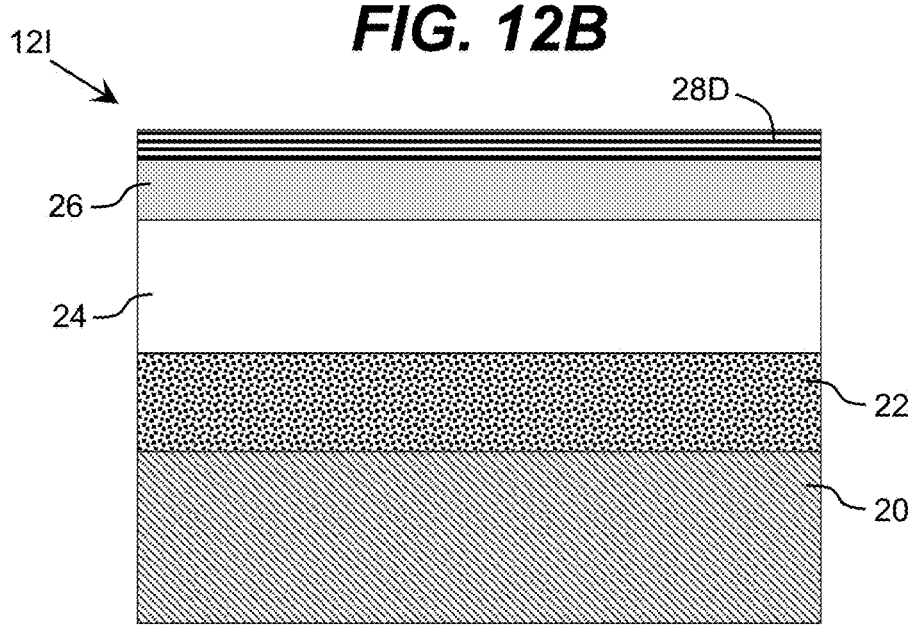

FIGS. 12A and 12B show other illustrative light emitting semiconductor structures 12H, 12I according to embodiments. In particular, in each structure 12H, 12I, an outer wave-guiding layer 28D forms a Bragg-like wave-guiding layer. In the structure 12I, the Bragg-like wave-guiding layer 28D is only included on a side of the active region 26 that is desired to be thin to allow the electron beam to pass there through. In the structure 12H, an interior wave-guiding layer 28C also forms a Bragg-like wave-guiding layer. While the structure 12I is shown implemented without an interior wave-guiding layer, it is understood that embodiments can include an interior wave-guiding layer configured as described herein.

Each wave-guiding layer 28C, 28D can comprise, for example, an AlGaN/AlN superlattice forming a Bragg reflector, a one-dimensional photonic crystal, or the like. In a more specific embodiment, a wave-guiding layer 28C, 28D can comprise an $Al_xGa_{1-x}N/AlN$ superlattice with the layer thickness chosen, for instance, to coincide with one quarter of the wavelength of the emitted light in the wave-guiding layer 28C, 28D (similar to the criteria needed for Bragg reflectors). Alternatively, the superlattice layers can comprise multiple period superlattices with fine period superlattices having a period of a few-to-few tens of nanometers and a large period superlattice having variations on the scale of one quarter wavelength of the emitted radiation. For example, the large scale superlattice can comprise a first and second sub-layer, each of which includes a short period superlattice forming a structure having $Al_{x1}Ga_{1-x1}N/Al_{x2}Ga_{1-x2}N$ and $Al_{y1}Ga_{1-y1}N/Al_{y2}Ga_{1-y2}N$, respectively. In this case, y1 can be different from x1 and y2 can be different from x2 by a specific amount. In an embodiment, y1 can be greater than x1 by 5-20% and y2 can be greater than x2 by 5-20%. However, it is understood that other embodiments are possible with different aluminum molar fractions for x1 y1 x2 and y2. The selected molar fractions can be optimized to improve the wave-guiding properties of the corresponding wave-guiding layer 28C, 28D, and can be found through numerical simulation. In addition to optimizing the x1, x2, y1 and y2 aluminum molar fractions, the thicknesses of the layers and sublayers can be optimized to provide good optical properties.

In addition to optimizing optical properties of the proposed superlattices for the wave-guiding layers 28C, 28D, doping of the semiconductor layers within a superlattice can be tailored to provide the improved electrical conductivity. For example, doping of the barriers within the superlattice can be selected to match the energy levels of the states within the quantum wells as shown in U.S. patent application Ser. No. 13/162,908, filed on 17 Jun. 2011, which is hereby incorporated by reference. It is understood that the superlattice layers, in addition to the aforementioned properties, can have layers with interfaces between the layers being graded.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

Figure 13:
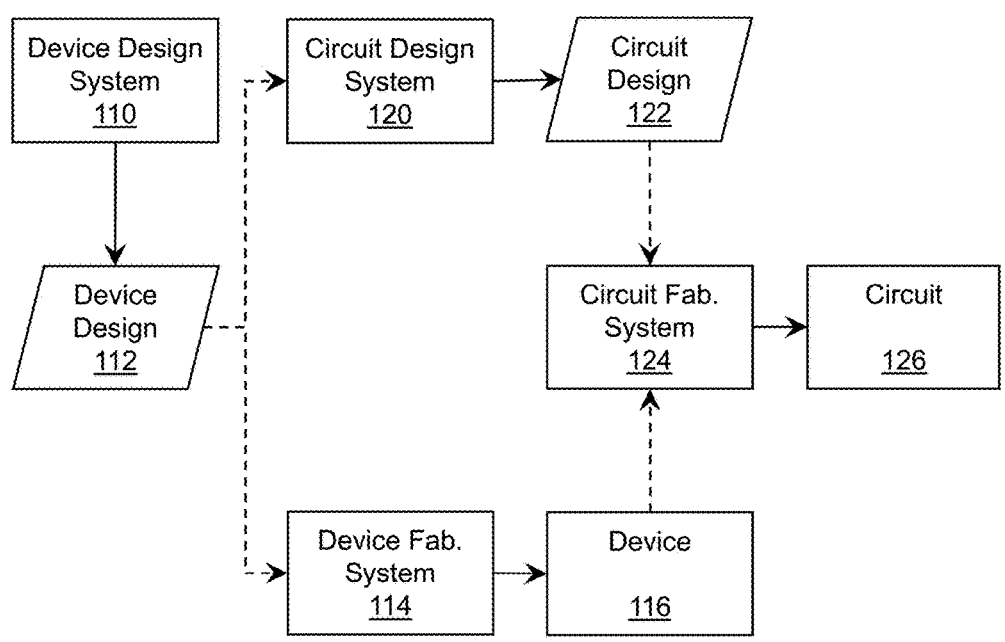
FIG. 13 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 13 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
   a light emitting semiconductor structure including:
   an active region; and
   a wave guiding structure covering only a portion of a lateral surface of the active region;
   a set of semiconductor layers located between the active region and the wave guiding structure, wherein the set of semiconductor layers cover only a portion of the lateral surface of the active region; and
   means for directing an electron beam over only a portion of the lateral surface of the light emitting semiconductor structure, wherein the electron beam forms a non-zero angle with the normal of the lateral surface and impacts the lateral surface of the light emitting semiconductor structure in an area not including the wave guiding structure.

2. The device of claim 1, wherein the angle is configured to maximize generation of electron-hole pairs within the active region of the light emitting semiconductor structure.

3. The device of claim 1, wherein the wave guiding structure covers only a laterally central portion of the active region.

4. The device of claim 1, wherein the non-zero angle causes excitation of electron-hole pairs located in the active region directly below the wave guiding structure.

5. The device of claim 1, further comprising means for directing a second electron beam, distinct from the electron beam, over at least a second portion of the lateral surface of the light emitting semiconductor structure, wherein the second electron beam forms a non-zero angle with the normal of the lateral surface.

6. The device of claim 5, wherein the electron beam and the second electron beam form different angles with the normal of the lateral surface.

7. The device of claim 5, further comprising means for independently operating each of the means for directing.

8. The device of claim 5, wherein the electron beam and the second electron beam have different energies, wherein an average peak penetration of the electron beams is to a location corresponding to approximately a midpoint of a thickness of the active region located in the light emitting semiconductor structure.

9. The device of claim 1, wherein the light emitting semiconductor structure includes a discharge structure, wherein the discharge structure includes a least one metal layer located on an exterior surface of the light emitting semiconductor structure.

10. The device of claim 9, wherein the discharge structure further includes a plurality of protrusions extending into the light emitting semiconductor structure.

11. The device of claim 10, wherein at least a portion of the protrusions extend partially into the active region.

12. A device comprising:
    a light emitting semiconductor structure comprising:
    an active region configured to emit light;
    a first wave guiding structure covering at least an inner portion of a first lateral surface of the active region; and a set of semiconductor layers located between the active region and the first wave guiding structure, wherein the set of semiconductor layers cover only a portion of the first lateral surface of the active region; and means for directing an electron beam onto an area of an outer lateral surface of the light emitting semiconductor structure not including the first wave guiding structure, wherein the electron beam forms a non-zero angle with the normal of the outer lateral surface.

13. The device of claim 12, the structure further comprising a discharge structure, wherein the discharge structure includes a least one metal layer located on an exterior surface of the light emitting semiconductor structure.

14. The device of claim 12, wherein the area of the outer lateral surface corresponds to an area of the first lateral surface of the active region immediately adjacent to an edge of the set of semiconductor layers.

15. The device of claim 12, wherein the first wave guiding structure forms a Bragg-like wave-guiding layer.

16. The device of claim 12, wherein the light emitting semiconductor structure further includes a second wave guiding structure covering all of a second lateral surface of the active region, wherein the second lateral surface is located opposite of the first lateral surface of the active region.

17. The device of claim 12, wherein the means for directing the electron beam includes an electron beam pump source mounted to emit the electron beam at the non-zero angle to the outer lateral surface of the light emitting semiconductor structure.

18. A light emitting device comprising:

a light emitting semiconductor structure including:

an active region configured to emit light;

a first wave guiding structure covering only a portion of a first lateral surface of the active region; and a set of semiconductor layers located between the active region and the first wave guiding structure, wherein the set of semiconductor layers cover only a portion of the first lateral surface of the active region; and an electron beam pump source mounted to emit an electron beam that directly impacts a region of the first lateral surface of the active region, wherein the electron beam forms a non-zero angle with the normal of the first lateral surface, wherein the region impacted by the electron beam is adjacent to an edge of the set of semiconductor layers, and wherein the non-zero angle causes excitation of electron-hole pairs located in the active region directly below the wave guiding structure.

19. The device of claim 18, further comprising a control component configured to adjust at least one of: the non-zero angle or an energy of the electron beam.

20. The device of claim 18, wherein the light emitting semiconductor structure further includes a discharge structure, wherein the discharge structure includes a least one metal layer located on an exterior surface of the light emitting semiconductor structure.

* * * * *